United States Patent [19]
Schlichte

[11] 4,118,697
[45] Oct. 3, 1978

[54] SWITCHING ARRANGEMENT FOR CONVERTING ANALOG SIGNALS INTO DIGITAL SIGNALS AND DIGITAL SIGNALS INTO ANALOG SIGNALS

[75] Inventor: Max Schlichte, Munich, Germany

[73] Assignee: Siemens Aktiengesellschaft, Munich, Germany

[21] Appl. No.: 751,980

[22] Filed: Dec. 20, 1976

[30] Foreign Application Priority Data
Jan. 30, 1976 [DE] Fed. Rep. of Germany ....... 2603608

[51] Int. Cl.$^2$ ............................................. H03K 13/02
[52] U.S. Cl. .......................... 340/347 C; 340/347 SH
[58] Field of Search ......... 340/347 M, 347 SH, 347 C

[56] References Cited
U.S. PATENT DOCUMENTS
3,993,992  11/1976  Zwack ............................. 340/347 C FOREIGN PATENT DOCUMENTS
772,714  4/1957  United Kingdom ................ 340/347 M

*Primary Examiner*—Charles D. Miller
*Attorney, Agent, or Firm*—Schuyler, Birch, Swindler, McKie & Beckett

[57] ABSTRACT

Apparatus for converting analog to digital signals and vice versa is described wherein a storage capacitor provided at an input of a codec operating in accordance with the iterative method and designed for receiving analog signals to be converted into digital signals is further connected either to a constant current generator or to the digital-to-analog converter of the codec for a period during which a voltage may be applied to the capacitor which correponds to a digital signal that is to be converted into an analog signal and that has been applied to the digital-to-analog converter. A two-wire circuit transmitting analog signals in both directions of transmission is connected to the storage capacitor. The resonance-exchange-of-charge method is used for the transmission of the analog signals.

5 Claims, 3 Drawing Figures

SWITCHING ARRANGEMENT FOR CONVERTING ANALOG SIGNALS INTO DIGITAL SIGNALS AND DIGITAL SIGNALS INTO ANALOG SIGNALS

BACKGROUND OF THE INVENTION

The invention relates to a switching arrangement for converting analog signals, more particularly pulse amplitude modulated (PAM) signals, into digital signals, more particularly pulse code modulated (PCM) signals, and for converting digital signals, more particularly PCM signals, into analog signals, more particularly PAM signals, by using an analog-to-digital converter operating in accordance with the iterative method.

Conventionally, converters for carrying out the foregoing functions use an analog comparator at one input of which there is located a storage capacitor to which is applied the analog signal to be converted into a digital signal and from the output of which a digital-to-analog converter is controlled by a register. The register receives, during the conversion of an analog signal into a digital signal, a continually changing code chain. During the conversion of a digital signal into an analog signal, the digital signal concerned is applied to the register. The digital-to-analog converter is connected by its output to the other input of the analog comparator.

A switching arrangement of the type described hereinabove, commonly referred to as a "codec" (coder/decoder), is known and is described in U.S. Pat. No. 3,883,864. In this prior art switching arrangement, an analog signal to be converted into a digital signal is stored as a PAM signal on a storage capacitor connected to an input of an analog comparator. To another input of the analog comparator, which is constituted by an operational amplifier, there is applied a reference voltage varying with time in accordance with a given characteristic. If the comparator in question finds an agreement between the signals being compared, it sends a drive pulse to a shift register in which with the occurrence of the drive pulse in question there is included a code chain which corresponds to the aforesaid analog signal. The code chain originates in a counter which with the occurrence of the reference voltage for the aforesaid analog comparator running through a given amplitude range sweeps through all the counter positions. Thus, there is a fixed relationship between the counter positions of the counter in question and the amplitudes of the reference voltage.

If a digital signal is to be converted into an analog signal with the switching arrangement described hereinabove, the digital signal is first compared by means of a digital comparator with the various code chains emitted from the aforesaid counter. If there is agreement between the digital signal and one of the code chains, a signal having the amplitude of the aforesaid comparator signal and existing at the time in question is buffered on another intermediate storage and passed on to a receiver over a separate circuit. Thus, two two-wire circuits are needed for the transmission of the analog signals: one two-wire circuit for the application of analog signals to be converted into digital signals, and another two-wire circuit for the retransmission of analog signals corresponding to converted digital signals. Thus, the number of circuits required is relatively great.

Another form of switching arrangement of the type mentioned hereinabove and also known as a codec is described in U.S. Pat. No. 3,540,037, wherein a digital signal to be converted into an analog signal, after storage in a register, controls an R-2R resistor network forming a digital-to-analog converter producing at the output of the resistor network an analog signal voltage corresponding to the digital signal being converted. The analog signal voltage is transmitted over a differential amplifier connected as an operational amplifier to a separate transmission line. An analog signal to be converted into a digital signal is applied to a comparator in conjunction with an analog reference voltage generated by the R-2R resistor network. In this case, the comparator controls, at its output, by means of a program control logic system, the setting or the contents of the register mentioned hereinabove which, in this case, functions as a counter and controls the R-2R resistor network.

If the comparator finds agreement between the analog signal applied thereto and the analog comparator voltage supplied by the R-2R resistor network, the setting of the register (counter) stops; the code chain existing in the register at the particular time then is the digital signal corresponding to the analog signal concerned and said digital signal can be transmitted over a separate circuit. Thus, in this prior art codec, too, two separate two-wire transmission circuits are necessary for the transmission of analog signals. As mentioned hereinabove, this requires a comparatively great number of circuits.

It is an object of the invention to provide a circuit arrangement of the type mentioned hereinabove capable of transmitting over one and the same two-wire circuit analog signals to be converted into digital signals and analog signals which are obtained by converting digital signals.

SUMMARY OF THE INVENTION

In accordance with the invention, the foregoing and other objects are obtained in a switching arrangement of the type described hereinabove wherein one input of an analog comparator is connected by a switch to a two-wire circuit over which the analog signals may be transmitted. A constant current generator is connected between one input of the analog comparator and the output thereof over another switch. The first switch is closed for a period during which a storage capacitor is charged through an analog signal to be converted into a digital signal and/or during which said storage capacitor is discharged during the delivery of an analog signal corresponding to a digital signal, depending on which type of conversion is being carried out. The other switch, after reception of a digital signal to be converted into an analog signal in the register of the analog-to-digital converter, is closed for a period during which the storage capacitor may be charged up to a voltage corresponding to the voltage supplied by the digital-to-analog converter in response to the application of the digital signal.

Another solution to the above problem within the scope of the invention is to connect one input of the analog comparator by a switch to a two-wire circuit over which the analog signals may be transmitted. The output of the digital-to-analog converter is connected by another switch and a series-connected isolation amplifier to the same input of the analog comparator, and the switch is closed for a period during which the storage capacitor is charged through an analog signal to be converted into a digital signal and/or during which said storage capacitor is discharged during the delivery of an analog signal corresponding to a digital signal. The other switch upon reception of a digital signal in the register of the analog-to-digital converter and to be converted into an analog signal is closed for a period during which the storage capacitor can be charged to a voltage corresponding to the voltage supplied by the digital-to-analog converter in response to the application of the digital signal.

One advantage of the invention over the prior art switching arrangements described hereinabove is that it manages with fewer circuits for the transmission of the analog signals. In accordance with the principles of the invention, one and the same two-wire circuit is used for transmitting the analog signals to be converted into digital signals by the analog-to-digital converter and for transmitting the analog signals that have been generated by the digital-to-analog converter of said analog-to-digital converter in response to the reception of appropriate digital signals without interaction between the analog signals during the transmission of said signals.

In the last-mentioned solution to the above problem, it is of advantage if the analog comparator in question is comprised of an operational amplifier whose output may be connected to said one input via said other switch. This has the advantage that one can manage without a special isolation amplifier, since the operational amplifier constituting the comparator can also perform the function of the isolation amplifier.

According to another embodiment of the invention, an inductance is connected in a series with the two-wire circuit and coupled to a bypass capacitor of a low-pass filter particularly associated with a subscriber set. This has the advantage that analog signals can be transmitted over the two-wire circuit utilizing the resonance-transfer method between the storage capacitor and the bypass capacitor.

BRIEF DESCRIPTION OF THE DRAWINGS

The principles of the invention will now be described by describing alternate preferred embodiments with reference to the accompanying drawings, wherein.

DETAILED DESCRIPTION OF THE PREFERRED EMBODIMENTS

Figure 1:
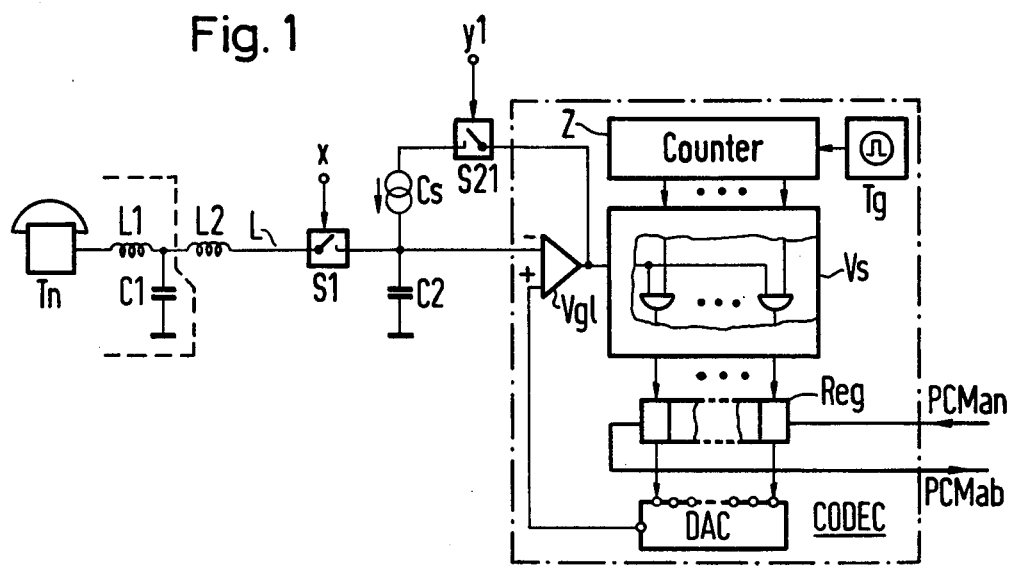
FIG. 1 is a schematic diagram illustrating a first preferred embodiment of the switching arrangement in accordance with the invention.

The switching arrangement shown in FIG. 1 comprises a circuit component enclosed by a dash-dotted line and generally known as a "codec." As will be apparent further below, the codec comprises an analog-to-digital converter which operates in accordance with the iterative method and which allows the conversion of analog signals, particularly PAM signals, into digital signals, more particularly PCM signals, and the conversion of digital signals, more particularly PCM signals, into analog signals, more particularly PAM signals, by means of an associated digital-to-analog converter. The codec in question comprises an analog comparator $Vgl$ which may be an operational or a differential amplifier. At the output of the comparator $Vgl$, there is connected a combinational logic circuit $Vs$. From FIG. 1 it is apparent that logic elements (e.g., AND elements) contained in the logic $Vs$ may be connected directly with one input to the output of the analog comparator $Vgl$. With their other inputs the logic elements are connected to the outputs of a counter Z which receives from a clock generator $Tg$ consecutive clock pulses for a pulse count. The counter Z may be a 1-out-of-$n$ counter or a binary counter having a subsequent decoder network; it must always deliver an output signal at one of its outputs.

The inputs of register stages of a shift register $Reg$ are connected to the output of the logic network $Vs$. A digital-to-analog converter DAC is connected with its inputs to the outputs of the register stages of the shift register $Reg$. The output of the digital-to-analog converter DAC is connected to the lower input (+) (FIG. 1) of the analog comparator $Vgl$. The digital-to-analog converter DAC may be a R-2R resistor network such as employed in one of the prior art switching arrangements described hereinabove.

In the present case, the shift register $Reg$ is connected by one shifting input to a two-wire circuit PCMan that transmits digital signals, more particularly PCM signals, in an incoming direction; the shift register $Reg$ is connected by a shifting output to a two-wire circuit PCMab that transmits digital signals, more particularly PCM signals, in an outgoing direction. Thus, both two-wire circuits PCMan and PCMab form together a four-wire telecommunication circuit for the transmission of digital signals, more particularly PCM signals, in both directions of transmission.

A storage capacitor C2 is connected to the other input (−) of the analog comparator $Vgl$. There are buffered on the storage capacitor C2 both the analog signals to be converted into digital signals during a coding operation and the analog signals that have been generated by the codec after conversion (decoding) of digital signals applied thereto. This will be detailed further hereinbelow. The analog signals in question are applied from a two-wire circuit L or delivered thereto by operating a switch S1. An inductance L2 is connected in series with the two-wire circuit L, to a junction point common to another inductance L1 and a bypass capacitor C1. The bypass capacitor C1 forms together with the inductance L1 at least one portion of a low-pass filter to which, as exemplified in FIG. 1, may be connected a subscriber set $Tn$.

In addition to the circuit elements described hereinabove, the switching arrangement of FIG. 1 includes a constant current generator $Cs$ which is switched into circuit by means of another switch S21 into a point between the output of the analog comparator $Vgl$ and the (−) input, therof.

Figure 2:
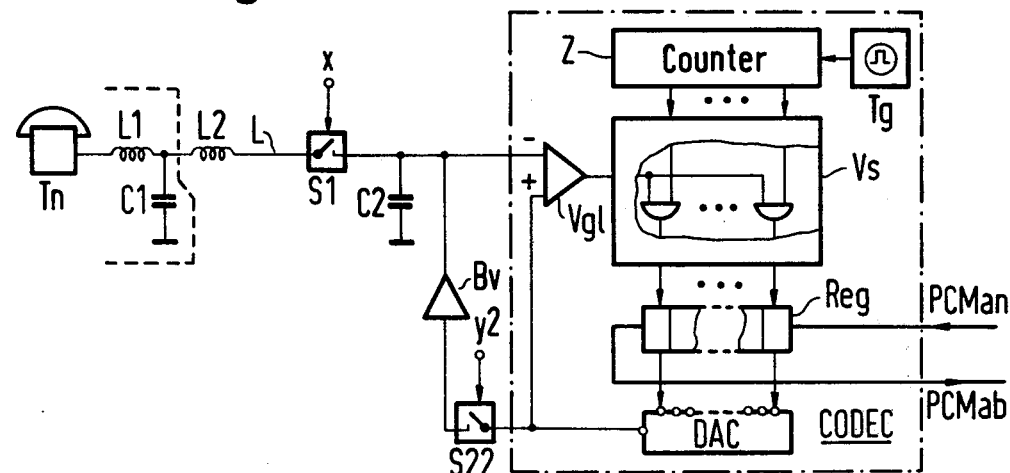
FIG. 2 is a schematic diagram of a second preferred embodiment of the switching arrangement in accordance with the invention.

Like the switching arrangement of FIG. 1, the switching arrangement of FIG. 2 comprises a codec having an analog-to-digital converter (coder) operating in accordance with the iterative method. The codec is designed in the same manner as the codec of FIG. 1. Accordingly, like reference numerals in FIGS. 1 and 2 denote like circuit elements. Like the codec of FIG. 1, the codec of FIG. 2 is connected by its input (i.e., one input of the analog comparator $Vgl$) designed for receiving analog signals to a storage capacitor C2 and by a switch S1 to a two-wire circuit L. Like in FIG. 1, the two-wire circuit L is connected by an inductance L2 to a low-pass filter comprising an inductance L and a capacitor C1. A subscriber set $Tn$ may likewise be connected to the low-pass filter. It should be noted that in contrast to the conditions shown in FIGS. 1 and 2, it is not necessary that a subscriber set Tn be connected to the storage capacitor C by an inductance L1. It is also possible to connect another codec to the capacitor C1.

Unlike the switching arrangement of FIG. 1, the output of the digital-to-analog converter DAC in the switching arrangement of FIG. 2 is connected by another switch S22 connected in series with an isolation amplifier Bv to the aforementioned one input of the analog comparator Vgl, i.e., to the input (−) of the analog comparator Vgl to which the storage capacitor C2 is connected. Where necessary, the function of the isolation amplifier Bv may likewise be performed by the analog comparator Vgl if, as mentioned hereinabove, the analog comparator is formed of an operational amplifier. In this case, it would be sufficient to connect the switch S22 between the output and the one input (−) (to which the storage capacitor C2 is connected) of the operational amplifier considered.

After describing the structures of the switching arrangements of FIGS. 1 and 2 to the extent necessary herein, their modes of operation will now be described.

Figure 3:
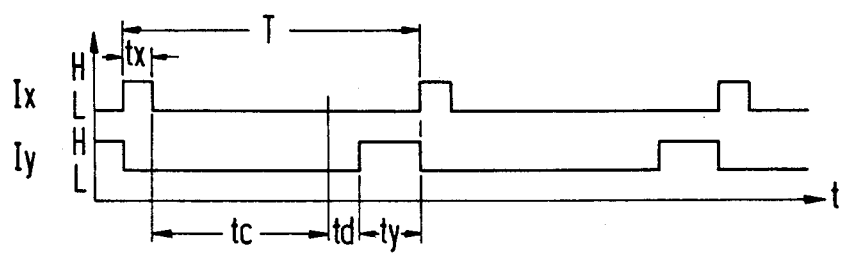
FIG. 3 is a pulse-timing chart illustrating the course of drive pulses for the operation of switching provided in the switching arrangement shown in FIGS. 1 and 2.

The pulse-timing chart in FIG. 3 shows the waveforms of pulses that may occur at the activating inputs x, y1 or x, y2 of the switches S1, S21 or S1, S22, respectively. In FIG. 3, the pulses occurring at the activating inputs x of the switches S1 are marked Ix and in FIG. 3 those appearing at the activating inputs y1 or y2 of the switches S21 or S22, respectively, are marked Iy. When the particular pulses Ix or Iy, respectively, occur, the corresponding activating inputs of said switches carry a high potential (H-signal); at all other times the activating inputs of the switches involved carry a low potential (L-signal).

As apparent from FIG. 3, pulses Ix and Iy alternate. In response to the appearance of the single activating pulses Ix or Iy the following processes take place. Responsive to the appearance of an activating pulse Ix during a time interval tx (of, e.g., 5 μs) (corresponding to the duration of an interval of a time slot allocated to a circuit and having time slots recurring in pulse frames in successive cycles), an analog signal to be converted into a digital signal may be stored as a PAM signal on the storage capacitor C2 over the two-wire circuit L. Concurrently with the storage of such an analog signal on the intermediate storage C2, an analog signal previously stored on the intermediate storage C2 may be transmitted to the capacitor C1 via the two-wire circuit L, taking as a basis the conditions shown in FIGS. 1 and 2 and applying the well-known resonance-exchange-of-charge method. That means that the charges held on capacitors C1 and C2 are exchanged as switch S1 is being closed.

Within the interval tc, which starts with the trailing edge of the activating pulse Ix, the codec executes one conversion, during which the analog signal stored on storage capacitor C2 is converted into a digital signal. At the end of this conversion process, which operates in accordance with the well-known iterative method, there is in the shift register Reg a code chain which is the digital signal of the analog signal still stored on the storage capacitor C2.

Within the interval td immediately following the interval tc, the code chain held in the shift register Reg may be shifted out of the shift register and passed on to a signal receiver over the circuit PCMab. Concurrently therewith, a code chain representing a digital signal to be converted into an analog signal may be introduced into the shift register Reg over the circuit PCMan. At the end of the interval td, the digital signal to be converted into an analog signal may be held in the shift register Reg. Thus, practically, at this time there is provided at the output of the digital-to-analog converter DAC a voltage constituting the analog signal of the digital signal being converted.

An activating pulse Iy occurs during the interval ty having a period of, e.g., 10μs immediately following the interval td. Its appearance causes the storage capacitor C2 to carry a voltage at the end of the interval ty corresponding to the voltage at the output of the digital-to-analog converter DAC. In the case of the switching arrangement of FIG. 1, the storage capacitor C2 is charged or discharged over the activated constant current generator Cs during the appearance of an activating pulse Iy. This occurs in such a way that at the end of the interval ty there is applied the voltage generated at the input of the analog comparator Vgl connected to the output of the digital-to-analog converter DAC. It should be noted that the polarity of the voltage to which the storage capacitor may be charged to maximum capacity due to the activation of the constant current generator Cs is opposite to that of the voltage to which the storage capacitor C2 may be charged to maximum capacity from the subscriber set Tn and which is the analog signal which has previously been converted into a digital signal. In absolute terms, however, the voltages in question are applied within equally large amplitude ranges. The latter also applies to the switching arrangement of FIG. 2.

With regard to the switching arrangement of FIG. 2, it should be noted that during the interval ty, i.e., during the operation of switch S22, the application of the voltage existing at the output of digital-to-analog converter DAC to storage capacitor C2 is assured at the end of the interval by means of isolation amplifier Bv. Amplifier Bv preferably has a high input impedance and a low output impedance.

After interval ty expires, i.e., when switch S21 or S22 reopens, a voltage constituting the analog signal and corresponding to the digital signal fed previously to shift register Reg over circuit PCMan is applied to storage capacitor C2. In this way, one coding process (conversion of an analog signal into a digital signal) and one decoding process (conversion of a digital signal into an analog signal) have been performed during the interval T shown in FIG. 3. If the interval T equals the duration (e.g., 125μs) of a pulse frame in a time division multiplex system, an activating pulse Ix, as shown in FIG. 3, will reappear immediately after the disappearance of an activating pulse Iy. With regard to FIG. 3, it should be noted that the activating pulses Iy are shown as having a longer duration than the activating pulses Ix. This longer period is obtained because, at worst, in the case of the switching arrangement of FIG. 1 or FIG. 2, the discharge of the storage capacitor C2 by the activated constant current generator Cs lasts longer than an exchange of charges between the capacitors C1 and C2.

It should be noted that in contrast to the conditions described hereinabove and shown in FIGS. 1 and 2 for the two-way transmission of analog signals over the two-wire circuit L, the resonance-exchange-of-charge method need not be used. Thus, it is possible to close the particular switch S1 during the intervals tx so as to deliver analog signals to be converted into digital signals to the particular storage capacitor C2 via the associated two-wire circuit L. Other activating pulses would then have to be applied to the particular switch S1 during other intervals so as to pass on analog signals stored previously on the associated storage capacitor C2 over the associated two-wire circuit L. In this case, the activating pulses Iy would have to be terminated prior to the occurrence of the last-mentioned other activating pulses for the switch S1.

It is also possible to provide a codec operated in accordance with the principles of the invention in contrast to the conditions mentioned hereinabove not only for one subscriber set but in a PAM concentration stage for a number of subscriber sets.

The principles of the invention are described hereinabove by describing the construction and operation of alternate preferred embodiments. The described embodiments are to be considered only as being exemplary, and it is contemplated that the described embodiments can be modified or changed in ways known to those skilled in the art while remaining within the scope of the invention as defined by the appended claims.

I claim:

1. Apparatus for converting in accordance with the iterative method analog signals into digital signals and for converting digital signals into analog signals comprising:

analog comparator means comprised of a differential amplifier having a first input to which is connected a storage capacitor which receives and stores the analog signal to be converted into a digital signal or the analog signal converted from a digital signal, first switch means for connecting a two-wire circuit to said first input of said analog comparator means said first switch means being closed for a first predetermined period for connecting said storage capacitor to said two-wire circuit for receiving the analog signal to be converted and/or delivering the analog signal converted from a digital signal, wherein during said first predetermined period said storage capacitor is charged by the analog signal to be converted and, concurrently, said storage capacitor is discharged by delivering the analog signal converted from a digital signal, digital-to-analog converter means having an output connected to a second input of said analog comparator means, binary register means connected to receive a reference pulse chain during conversion of the analog signal or the digital signal to be converted, logic circuit means operable responsive to the output from said analog comparator means for controlling the coupling of the contents of said binary register means to said digital-to-analog converter means, constant current source, second switch means for connecting said constant current source between said first input of said analog comparator means and the output thereof, said second switch being closed after reception in said binary register of the digital signal to be converted for changing said storage capacitor to a voltage corresponding to the voltage output of said digital-to-analog converter means.

2. The apparatus defined in claim 1 further comprising:

an inductance and a bypass capacitor forming a low-pass filter connected in series with the two-wire circuit and said first input of said analog comparator means.

3. Apparatus for converting analog signals into digital signals and for converting digital signals into analog signals comprising:

analog comparator means comprised of a differential amplifier having a first input to which is connected a storage capacitor which is receives and stores the analog signal to be converted into a digital signal or the analog signal converted from a digital signal, first switch means for connecting a two-wire circuit to said first input of said analog comparator means, said first switch means being closed during a first predetermined period for connecting said storage capacitor to said two-wire circuit for receiving the analog signal to be converted and/or delivering the analog signal converted from a digital signal, wherein during said first predetermined period said storage capacitor is charged by the analog signal to be converted and, concurrently, said storage capacitor is discharged by delivering the analog signal converted from a digital signal, digital-to-analog converter means having an output connected to a second input of said analog comparator means, binary register means connected to receive a reference pulse chain during conversion of the analog signal or the digital signal to be converted, logic circuit means operable responsive to the output from said analog comparator means for controlling the coupling of the contents of said binary register means to said digital-to-analog converter means, second amplifier means, and second switch means connected between the output of said digital to analog converter and the input of said second amplifier for connecting an output of said digital to analog converter means through said amplifier means to said first input of said analog comparator means, said second switch being closed upon reception of a digital signal to be converted in said binary register means for a second predetermined period of time corresponding to the time required for changing said storage capacitor to a voltage corresponding to the voltage output from said digital-to-analog converter means.

4. The apparatus defined in claim 3 wherein said analog comparator means is an operational amplifier and wherein said second switch means connects a second input of said operational amplifier to said first input.

5. The apparatus defined in claim 3 further comprising:

an inductance and a bypass capacitor forming a low-pass filter connected in series with the two-wire circuit and said first input of said analog comparator means.

* * * * *